United States Patent
Huala et al.

(10) Patent No.: US 11,930,616 B2
(45) Date of Patent: Mar. 12, 2024

(54) COMBINED HEAT EXCHANGER AND RF SHIELD

(71) Applicant: Microsoft Technology Licensing, LLC, Redmond, WA (US)

(72) Inventors: Rob Huala, Bellevue, WA (US); Nanqiang Zhu, Bellevue, WA (US); Donovan D. Van Sleet, Graham, WA (US); Aaron Ray Paff, Duvall, WA (US); Andrew Douglas Delano, Woodinville, WA (US); Patrick Stephen Johnson, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 712 days.

(21) Appl. No.: 16/657,189

(22) Filed: Oct. 18, 2019

(65) Prior Publication Data

US 2021/0120698 A1    Apr. 22, 2021

(51) Int. Cl.
H05K 7/20    (2006.01)
H05K 9/00    (2006.01)

(52) U.S. Cl.
CPC ..... H05K 7/20172 (2013.01); H05K 7/20154 (2013.01); H05K 9/0081 (2013.01)

(58) Field of Classification Search
CPC .......... H05K 7/20172; H05K 7/20154; H05K 9/0081; F28D 15/02; F28D 15/00; F28D 15/04; F28D 15/043; F28D 15/0275
See application file for complete search history.

(56) References Cited

U.S. PATENT DOCUMENTS

| | | | | |
|---|---|---|---|---|
| 6,163,454 A * | 12/2000 | Strickler | .............. | H05K 9/0041 361/818 |
| 6,478,082 B1 * | 11/2002 | Li | .......... | F28F 13/003 257/E23.102 |
| 6,680,847 B2 * | 1/2004 | Heard | .................. | H05K 9/0041 174/382 |
| 6,813,152 B2 * | 11/2004 | Perazzo | ............. | H05K 7/20581 417/423.5 |
| 7,277,300 B2 * | 10/2007 | Sakamoto | ................. | G06F 1/18 174/355 |
| 7,492,610 B2 * | 2/2009 | Gilliland | .............. | H05K 9/0041 29/830 |

(Continued)

FOREIGN PATENT DOCUMENTS

| JP | 2004014638 A | 1/2004 |
|---|---|---|
| KR | 101346770 B1 | 12/2013 |

OTHER PUBLICATIONS

JP2004014638A mt (Year: 2004).*
Influence of nano-modification on the mechanical and electrical properties of conventional fibre-reinforced composites Florian H. Gojnya,*, Malte H.G. Wichmanna, Bodo Polymer Composites Section, Technical University Hamburg-Harburg, Denickestrasse 15, 21073 Hamburg, Germany (Year: 2005).*

(Continued)

*Primary Examiner* — Gordon A Jones
(74) *Attorney, Agent, or Firm* — Holzer Patel Drennan

(57) ABSTRACT

A thermal component has a shield portion and a heat exchanger portion. The shield portion includes a plurality of cells adapted to inhibit radio radiation (RF) having a frequency within a target frequency range, while the heat exchanger portion includes a plurality of elongated channels, each one of the elongated channels being physically connected to and in fluid communication with at least one corresponding cell of the plurality of cells.

24 Claims, 9 Drawing Sheets

(56) References Cited

U.S. PATENT DOCUMENTS

| | | | | |
|---|---|---|---|---|
| 7,532,473 | B2* | 5/2009 | Kuo | H01L 23/467 |
| | | | | 174/16.3 |
| 7,589,968 | B1 | 9/2009 | Oliver | |
| 7,697,293 | B1* | 4/2010 | Peng | H01L 23/467 |
| | | | | 361/689 |
| 7,804,687 | B2 | 9/2010 | Copeland et al. | |
| 9,578,781 | B2* | 2/2017 | Slippey | H05K 7/20336 |
| 10,165,696 | B1* | 12/2018 | Blasingame | H05K 5/0221 |
| 2003/0192715 | A1* | 10/2003 | Lambert | H05K 9/0041 |
| | | | | 174/355 |
| 2007/0147000 | A1 | 6/2007 | Kuo | |
| 2013/0145612 | A1* | 6/2013 | Busch | G06F 1/182 |
| | | | | 29/601 |
| 2017/0027085 | A1* | 1/2017 | Held | H05K 7/20727 |
| 2018/0249600 | A1* | 8/2018 | Coppola | H05K 7/20209 |
| 2020/0191498 | A1* | 6/2020 | Craig | H05K 7/2049 |

OTHER PUBLICATIONS

Load and health monitoring in glass fibre reinforced composites with an electrically conductive nanocomposite epoxy matrix; Lars Boger *, Malte H.G. Wichmann, Leif Ole Meyer, Karl Schulte; Institute of Polymers and Composites, Denickestrasse 15, 21073 Hamburg, Germany (Year: 2008).*

International Search Report and Written Opinion Issued in PCT Application No. PCT/US20/054875, dated Feb. 16, 2021, 9 Pages.

Jenkins, et al., "Metal Additive Structures on Printed Circuit Boards", Application as Filed in U.S. Appl. No. 16/386,947, filed Apr. 17, 2019, 22 Pages.

Sahoo, et al., "Application of TCE-PCM based Heat Sinks for Cooling of Electronic Components: A Review", In Journal of Renewable and Sustainable Energy Reviews, vol. 59, Jun. 1, 2016, pp. 550-582.

* cited by examiner

US 11,930,616 B2

COMBINED HEAT EXCHANGER AND RF SHIELD

BACKGROUND

In the design of consumer electronic devices, there are often heat-generating elements in the device which requires active cooling. The cooling is typically accomplished with one or more fans to circulate air within a device enclosure. Each fan must be designed and configured such that it generates enough pressure to overcome the net airflow impedance of the system. However, the action of the fan and the circulation of the air lead to generation of acoustic noise which can be an irritant to the user. Ongoing efforts to increase component power levels and reduce device volumetrics create challenges pertaining to heat dissipation and impedance mitigation within consumer electronic devices.

SUMMARY

According to some embodiments, a thermal component includes a shield and a heat exchanger. The shield is formed of a plurality of cells adapted to inhibit radio frequency (RF) radiation having a frequency within a target frequency range, and the heat exchanger includes a plurality of elongated channels that are each physically connected to and in fluid communication with at least one corresponding cell of the plurality of cells.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

DETAILED DESCRIPTION

Figure 1:
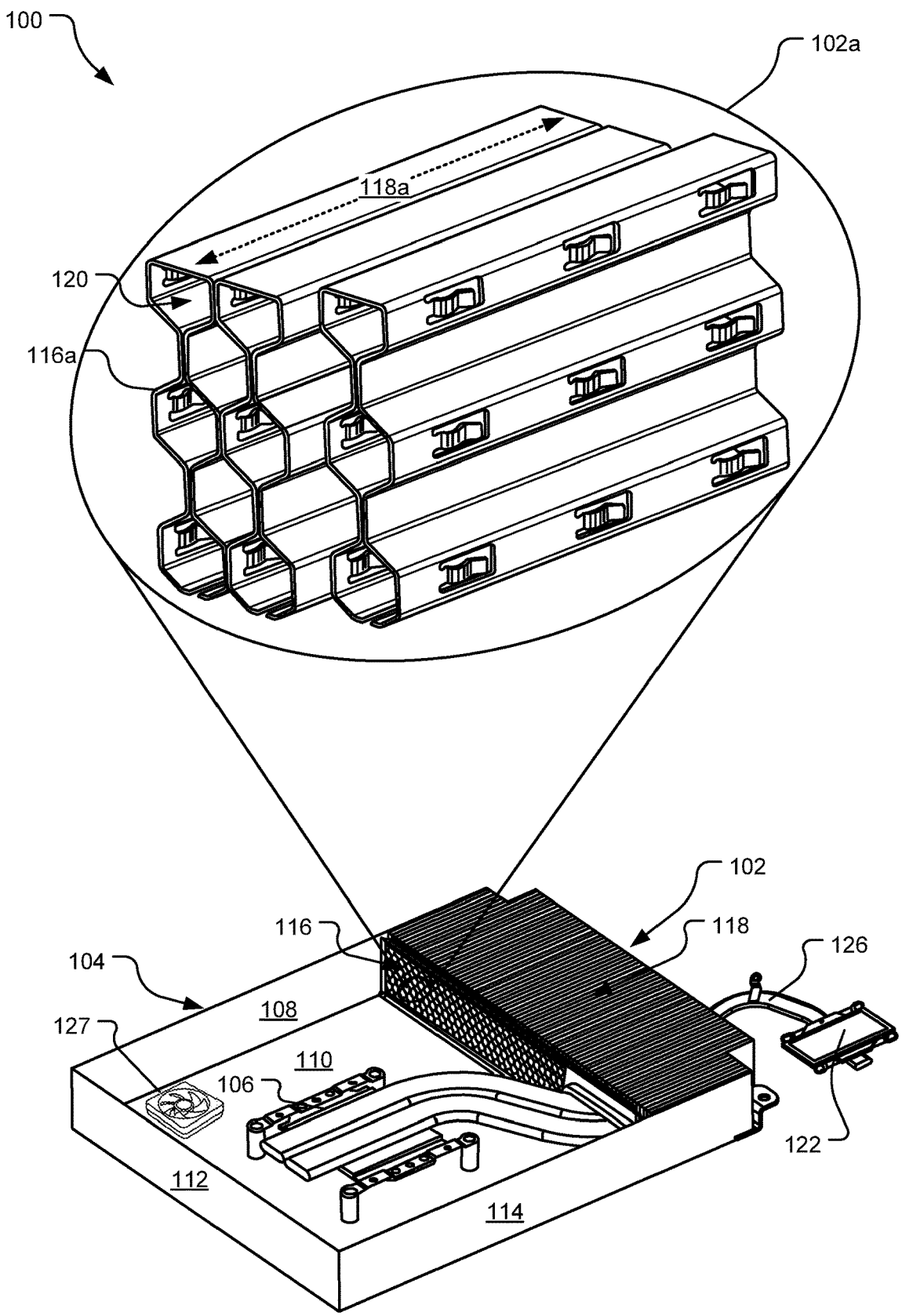
FIG. 1 illustrates an example electronic device including a thermal component that acts as an as both a shield against electromagnetic interference (EMI) and a heat exchanger.

Within mobile device enclosures, sensitive circuit components may be encased behind metal shields or in metal cages, known as Faraday cages, that offer protection from electro-magnetic interference (EMI) and radio frequency interference (RFI). For example, a shield may be utilized to encase individual components against a printed circuit board (PCB) of a device, such as to encase RF-emitting components as well as sensitive electrical components likely to be affected by EMI or RFI.

Traditional Faraday cases are constructed from electrically-conductive stamped sheet metal that is formed to fully enclose a component being protected (e.g., a component that is either a noise source for EMI or RFI or a component that is particularly sensitive to functional disruptions due to EMI/RFI). The Faraday cage functions to block electromagnetic noise from entering the cage and/or to contain electromagnetic noise generated internal to the cage.

In designs where the protected component generates heat, small holes may be added to the construction to allow airflow through the barrier (e.g., cage walls). These holes are carefully sized to at or below a defined minimum diameter to ensure that RF shielding capability is not compromised within a target frequency range.

In some consumer electronics, a Faraday cage may be used in close proximity to one or more heat exchangers designed to pull heat away from the same component that the Faraday cage is designed to protect. An ideal heat exchanger allows for high-efficiency heat transfer and low impedance to surrounding airflow. To meet these objectives, one prevalent heat exchanger design uses an array of straight, parallel fins stacked together. The fins move heat away from a heat-source (such as a cold-plate or a heat pipe) to the surrounding air.

Current consumer electronics designs typically implement the Faraday cages and heat exchangers as separate components, positioning the two components in series. These designs effectively direct an airflow through two individual consecutive barriers (e.g., one from the holes in the Faraday cage and another upon entering the "fins" of the heat exchanger). Effectively, these two separate barriers act as two separate sources of impedance. This traditional approach can reduce overall airflow, degrade thermal performance, and increase unwanted acoustic fan noise.

The technology disclosed herein proposes designs for a single thermal component that acts as both an electromagnetic shield (e.g., a wall that may be part of a Faraday cage) and a heat exchanger in accordance with various implementations. The combined design eliminates the above-described dual-barrier airflow impedance problem by providing both EMI shielding and heat dissipation functionality with a combined structure for which both the shielding and heat dissipation components share a common entrance point and a common exit point for the airflow, as opposed to directing the airflow through two separate barriers. By reducing airflow impedance, this design increases cooling efficiency and reduces fan noise. Moreover, manufacturing costs are also reduced as a consequence to utilizing a single low-cost component that performs functions traditionally performed by two separate components.

FIG. 1 illustrates an example electronic device 100 including a thermal component 102 that acts as an as both an EMI shield and a heat exchanger. The thermal component 102 forms one wall of a Faraday cage 104 that encases a protected component 106. In various implementation, the protected component 106 may be one or more RF source components or, alternatively, one or more RF susceptible electrical components. In the following description, the term "RF source component" refers to a component that generates electromagnetic radiation that may, if not contained, interfere with the functionality of other electronic components. For example, the Faraday cage 104 may be utilized to isolate a microprocessor from its surroundings. In contrast, an "RF susceptible component" is a non-emitting electrical component that is likely to be affected by EMI or RFI, such as circuit inputs, amplifier stages, cables and wires sensitive to cross-talk, etc.

In FIG. 1 the Faraday cage 104 is shown with a top panel omitted for clarity of illustration; however, it may be understood that the Faraday cage 104 is a 6-sided metal structure that fully encases the protected component 106 in accordance with some implementations. The five visible surfaces Faraday cage 104 include surfaces 108, 110, 112, 114, and a fifth surface referred to herein as an EMI shield portion 116, which is part of the thermal component 102. In addition to the EMI shield portion 116, the thermal component 102 also includes a heat exchanger portion 118 including a number of elongated channels that extend from and connect to the EMI shield portion 116.

Magnified view 102a shows a portion of the thermal component 102 in greater detail. This view illustrates a close-up subset 116a of the EMI shield portion 116 and a subset of the heat exchanger portion 118 comprising channels of example channel length 118a. From this view, it can be seen that the thermal component 102 is a porous, mesh-like metal wall with openings referred to herein as "cells" (e.g., a cell 120) that each direct airflow through a corresponding one of multiple channels that extending through the heat exchanger portion 118. In different implementations, the cells in the EMI shield portion 116 of the thermal component 102 may assume a variety of different shapes and sizes depending on a number of factors including a target shield frequency range of the Faraday cage 104 and corresponding EMI development requirements. In general, the cell apertures of the EMI shield portion typically have a diameter approximately 50 times smaller than the wavelength of the frequency of interest. In one implementation where the target shield frequency is 2.4 GHz, each of the cell apertures would have a diameter of approximately 2.5 mm.

In FIG. 1, the plurality of cells forming the EMI shield portion 116 each have a cellular wall that directly abuts (contacts) the cellular walls of multiple immediately adjacent cells. In the specific design illustrated, each cell is hexagonal, and each of the six segments of the hexagonal sidewall is in contact with a corresponding hexagonal sidewall segment of an adjacent cell. In other implementations, directly adjacent cells may share one or more walls. The hexagonal cell shape of FIG. 1 is meant to illustrate just one of many suitable shapes including without limitation, circular, other polygon or non-regular polygon shapes that meet manufacturing and assembly constraints. Notably, however, the illustrated hexagonal design may be particularly effective for heat dissipation due to the increased amount of contact surface area between adjacent cells as compared to designs of other shape. For example, the cell 116a is shown with three sidewalls each in contact with a different one of three sidewalls each bounding a different adjacent cell. Cells in the center of the honeycomb structure may have all six sides in contact with a sidewall of an adjacent cell. This increased cell-to-cell contact surface area provides for increased heat uptake (conduction) out of the airstream traveling through the thermal component 102.

Although the thermal component 102 may have different dimensions in different implementations, the length of each one of the elongated channels in the heat exchanger portion 118 may be understand as having a length (e.g., the channel length 118a) as being multiple times longer in length than the diameter of the cell 120 forming the opening to the each channel in order to effectively spread and dissipate the heat generated inside of the faraday cage 104.

In addition to those elements discussed above, the electronic device 100 includes a ventilation and cooling system that also includes one or more fans (e.g., a fan 127) internal to the faraday cage 104 to direct an airflow out through the thermal component 102. Some implementations may implement the thermal component 102 in a cooling system that does not include fans.

To further dissipate heat transferred to the thermal component 102, the electronic device 100 further includes a heat pipe 126 that couples to the thermal component 102 at a location external to the Faraday cage 104. The heat pipe 126 conducts heat away from the thermal component 102 and directs it to a heat spreader 122. Implementations including a heat pipe 126 and/or heat spreader may provide for thermal coupling between such components and the thermal component 102 a variety of different ways. Some implementation may exclude either the heat spreader 122, the heat pipe 120, or both.

In FIG. 1, each cell in the EMI shield portion 116 opens to exactly one channel and the internal shape of each channel matches the shape of the corresponding cell (e.g., hexagonal cellular openings in the EMI shield portion 116 are extended as hexagonal channels throughout the length of the heat exchanger portion 118) in accordance with some implementations.

The thermal component 102 may be made of a variety of suitable conductive materials including without limitation copper, aluminum and or other materials with suitable thermal conductivity.

Due to the fact that the cell structure can effectively shield radiated emissions, there is less impedance to airflow exiting the Faraday cage 104 as compared to designs where the Faraday cage 104 and heat exchanger are separate components acting as two separate barriers to an airflow stream.

Although not shown, it may be understood that the Faraday cage 104 may also include porous cellular openings for air intake (e.g., a second thermal component 102) and may also encase one or more fans for circulating airflow in from the air intake and out through the cells in the EMI shield portion 116.

Figure 2A:
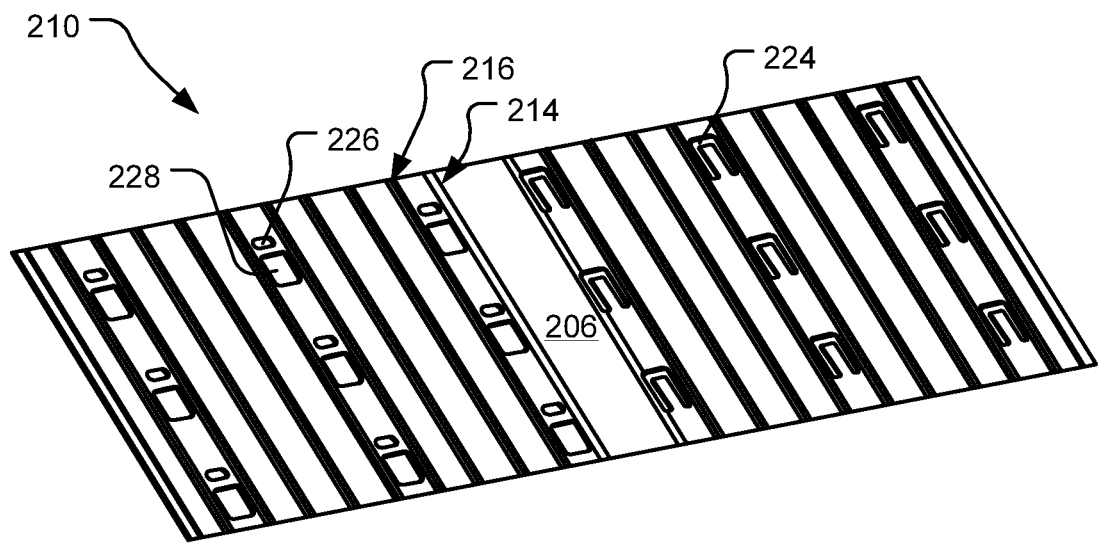
FIG. 2A illustrates an example metal planar component that can be physically manipulated during a manufacturing process to form a portion of a combined thermal component that acts as both an EMI shield and a heat exchanger.
Figure 2B:
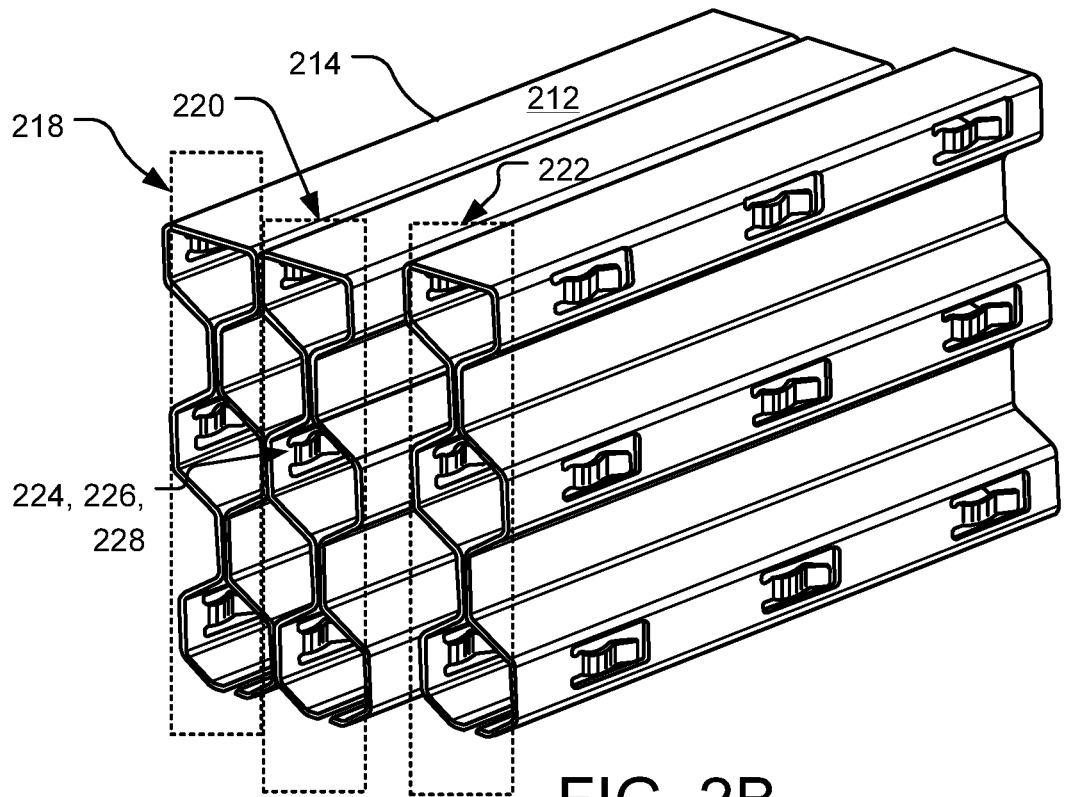
FIG. 2B illustrates columns of cells that are each formed from a planar metal component the same or similar to that shown in FIG. 2A.
Figure 2C:
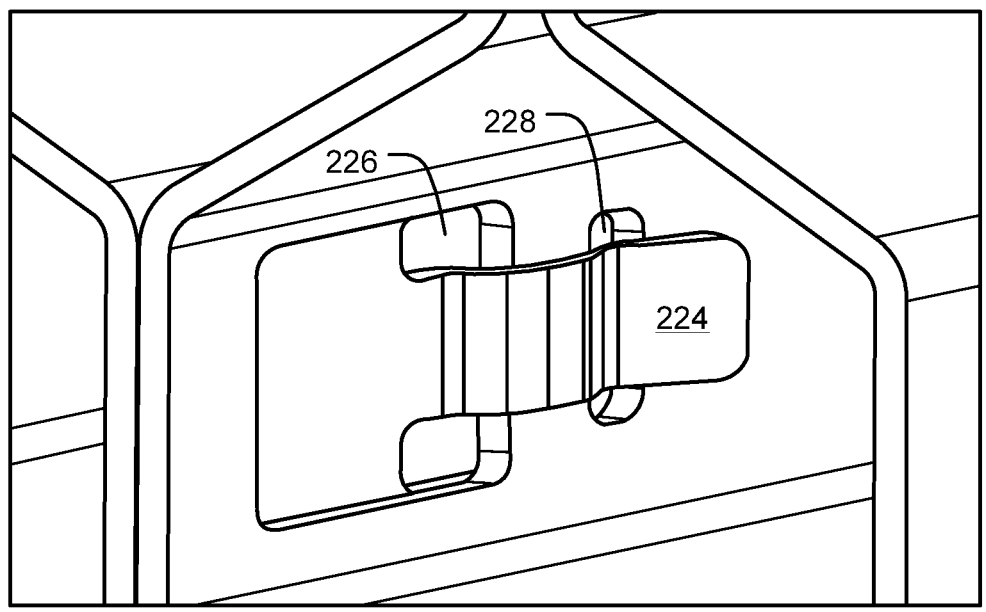
FIG. 2C illustrates a magnified view of the thermal component shown in FIG. 2A illustrating interlocking stamped features.

FIGS. 2A, 2B, and 2C illustrates different aspects of an example thermal component that acts as both an EMI shield and heat exchanger in accordance with some implementations. FIG. 2A illustrates an example metal planar component 210 that can be manipulated (e.g., bent and adhered to itself in different places) to form a portion of a combined thermal component that acts as both an EMI shield and a heat exchanger. During a construction process, the metal planar component 210 is bent along various deflection points (e.g., deflection points 214 and 216) to form a single cellular column that is then attached to other cellular columns to form a honeycomb structure similar to that shown and described with respect to FIG. 1.

FIG. 2B illustrates three example cellular columns 218, 220, 222 that are each formed from a different planar metal component the same or similar to that shown in FIG. 2A.

The planar metal components are individual bent along designated deflection points (e.g., a deflection point 214) to form the resulting cellular columns. For example, a central pane 206 of the metal planar component 210 in FIG. 2A may correspond to a top surface 212 of the cellular column 218.

In some implementations, interfacing adjacent surfaces of each individual cellular column are adhered together by conductive adhesive, solder, or other suitable means to form seams between those surfaces. In some implementations, the adhesive or solder is a thermally-conductive so as to distribute heat between cellular columns. In some implementations, the columns are mechanically-connected to one another (e.g., via snaps or latches). The different cellular columns 218, 220, and 222 are connected to one another along with several other like-columns to form a thermal component, such as thermal component 102 of FIG. 1, that acts as both an EMI shield and heat exchanger. Notably, column 222 is shown, for clarity, at a positional offset from the other two cellular columns 218 and 220. Once integrated into a final thermal component, the cellular column 222 may be aligned with the adjacent cellular column 220 in the same manner that the column 220 is aligned with the cellular column 218.

Although the different columns may be connected together in a number of suitable ways, the illustrated example uses a latch-and-hook type attachment mechanism. Specifically, FIG. 2A illustrates a number stamped features designed to interlock with one another such as by attaching a latch 224 (visible in FIG. 2A, 2B, 2C) to corresponding openings 226, 228 (e.g., also visible in FIG. 2A, 2B, 2C).

FIG. 2C illustrates a magnified view of the cellular column 218 that shows the above-described interlocking stamped features in greater detail. Specifically, the illustrated design includes a stamped latch (e.g., a latch 224 in FIG. 2A) formed on the cellular column 218. The latch 224 that has been bent inward and around a center post between two openings 226, 228 stamped on the adjacent cellular column 220 to attach the two cellular columns 218 and 220 together. In some implementations, adjacent columns may be attached to one another via other attachment mechanisms including without limitation conductive adhesive, solder, etc. (e.g., in addition to, or alternatively to, the stamped latches described above).

Once constructed, a thermal component formed by attaching together columns as described and illustrated above includes a porous honeycomb wall structure that acts an RF shield for radiation of within a target frequency range. Each one of the cells in the honeycomb wall structure extends in length to form a corresponding elongated channels that provide heat dissipation to air passing through the thermal component 202. Aspects of the thermal component 202 not explicitly described with respect to FIGS. 2A and 2B may be the same or similar to those described with respect to FIG. 1 or other implementations herein.

Figure 3A:
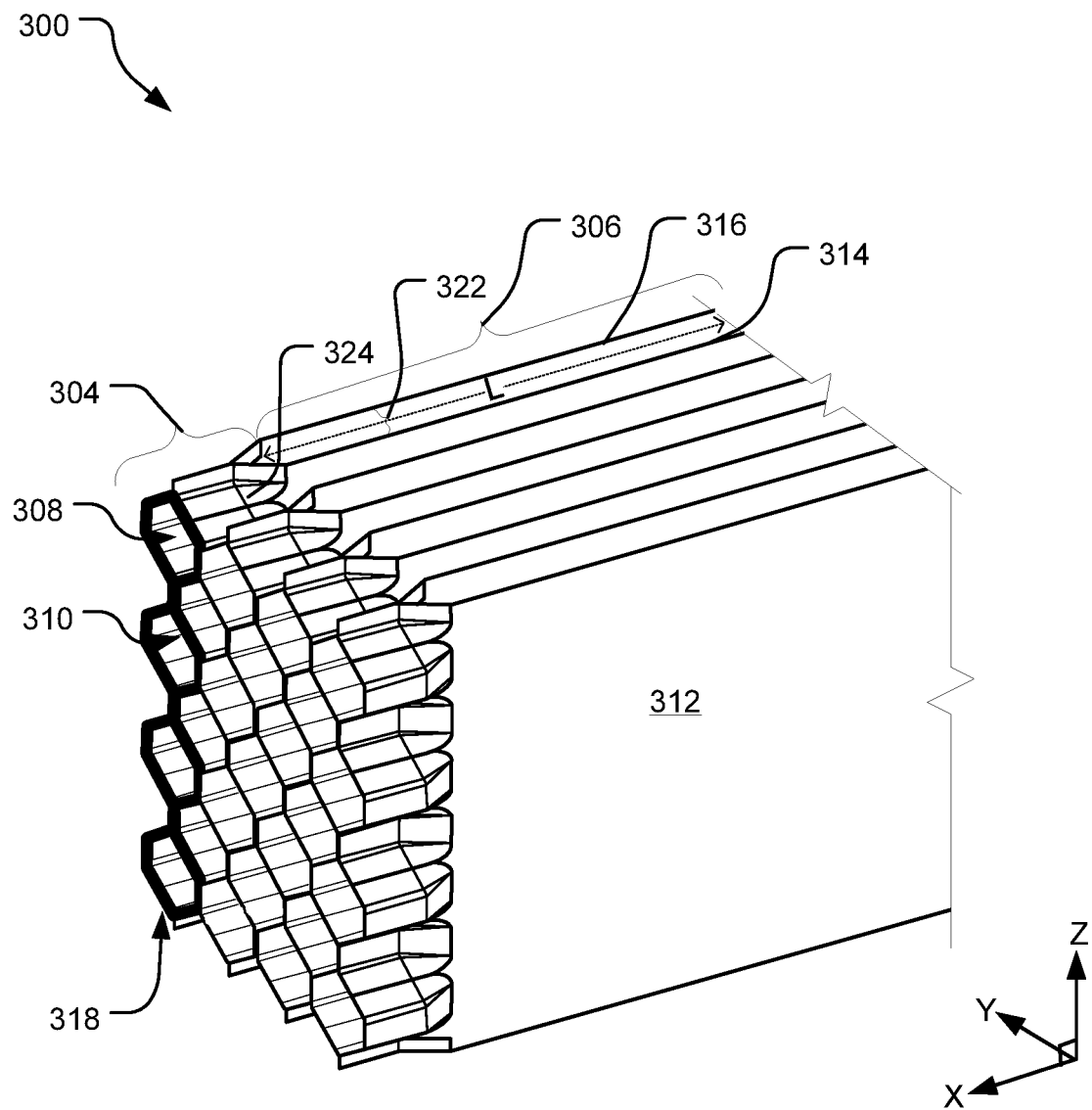
FIG. 3A illustrates a perspective view of another example thermal component that acts as an as both an EMI shield and a heat exchanger when integrated within an electronic device.

FIG. 3A illustrates a perspective view of another example thermal component 300 that acts as an as both an EMI shield and a heat exchanger when integrated within an electronic device. The thermal component 300 includes an EMI shield portion 304 and a heat exchanger portion 306. The EMI shield portion 304 is a wall formed by a honeycomb cell structure that is specifically engineered to meet designated EMI shielding requirements for radiation within a target frequency range. Such requirements may, for example, impose a limit on the maximum cell diameter such as by requiring that such diameter be smaller than the maximum peak-to-peak amplitude of within the target shield frequency range. In other implementations, the EMI shield portion 304 is designed to comply with EMI shielding requirements that provide a maximum percentage of open surface area in the EMI shield portion 306.

In one implementation, the thermal component 302 is integrated within an electronic device such that the EMI shield portion 306 forms one wall of a Faraday cage surrounding a RF source component or RF sensitive component. Although the porous cells forming the EMI shield portion are shown to be hexagonal and a hexagonal design may provide some advantages with respect to heat conduction and dissipation (e.g., due to increased surface area in contact between adjacent cells), other shapes may be suitable including those discussed elsewhere herein.

The implementation shown in FIG. 3A differs from FIG. 2A-2C in that vertically-adjacent cells (e.g., cells 308, 310) share dividing cell walls. While the heat exchanger portion 306 is comprised of elongated channels (e.g., an elongated channel 322 with length L), these channels are shaped and configured differently than those illustrated and described with respect to FIG. 1. Specifically, the heat exchanger portion 306 is comprised of a number of fins (e.g., fins 312, 314, 316) that extend from the cellular walls of the honeycomb structure forming the EMI shield portion 304 in accordance with some implementations. Each different column of the cells is in fluid communication with a different channel between a different respective pair of the fins. For example, the bolded column 318 of cells shown at the left side of the structure consists of cells that are each thermally and fluidly coupled to a same channel (e.g., the channel 322), which is formed between the fins 314 and 316. To accommodate this, each cell in the EMI shield portion has a tapered portion 324 that connects the cellular wall of the EMI shield portion 304 to a corresponding pair of fins of the heat exchanger portion 306 such that a single pair of fins extends from and connects to each cell within a same vertical column of the structure (e.g., the column 318).

In comparison to the embodiments shown in FIG. 1 through 2C, the embodiment of FIG. 3A may offer reduced impedance to airflow and therefore better heat dissipation due to the fact that the channels (e.g., the channel 322 of length L) have more open area for airflow. For example, the channels of the heat exchanger portion 306 each have an effective width that matches the diameter of an individual one of the cells (e.g., the cell 308) and a height that matches an entire column (e.g., the column 318) of the cells. In contrast, the implementation of FIG. 1 provides channel through the heat exchanger portion that each have a width and height effectively matching the width and height of a single cell opening in the shield portion.

In the implementations of FIG. 3A-3A the fins (e.g., 314 and 316) are shown to be planar. Planar fins may be particularly advantageous for manufacturing simplicity and ease of inter-component attachment; however, in at least one other implementation, the fins are of other shape (e.g., wavy, zig-zag, etc.).

The thermal component 302 may assume different dimensions in different implementations. In some implementations, the diameter of cells (e.g., openings) in the EMI shield portion 306 may be selected based on EMI shielding requirements to provide EMI shielding at within a target frequency range. The length of the fins 312, 314, 316 is, in contrast, selected so as to provide an optimized amount of heat dissipation an airflow passing therethrough. In one implementation, the fins 312, 314, and 316 are at least as long as ten times the diameter of each cell. For example, a common cell diameter used for EMI shielding in consumer electronics is 2.5 mm, while a common fin length for heat exchanger can be 50 mm or more.

Figure 3B:
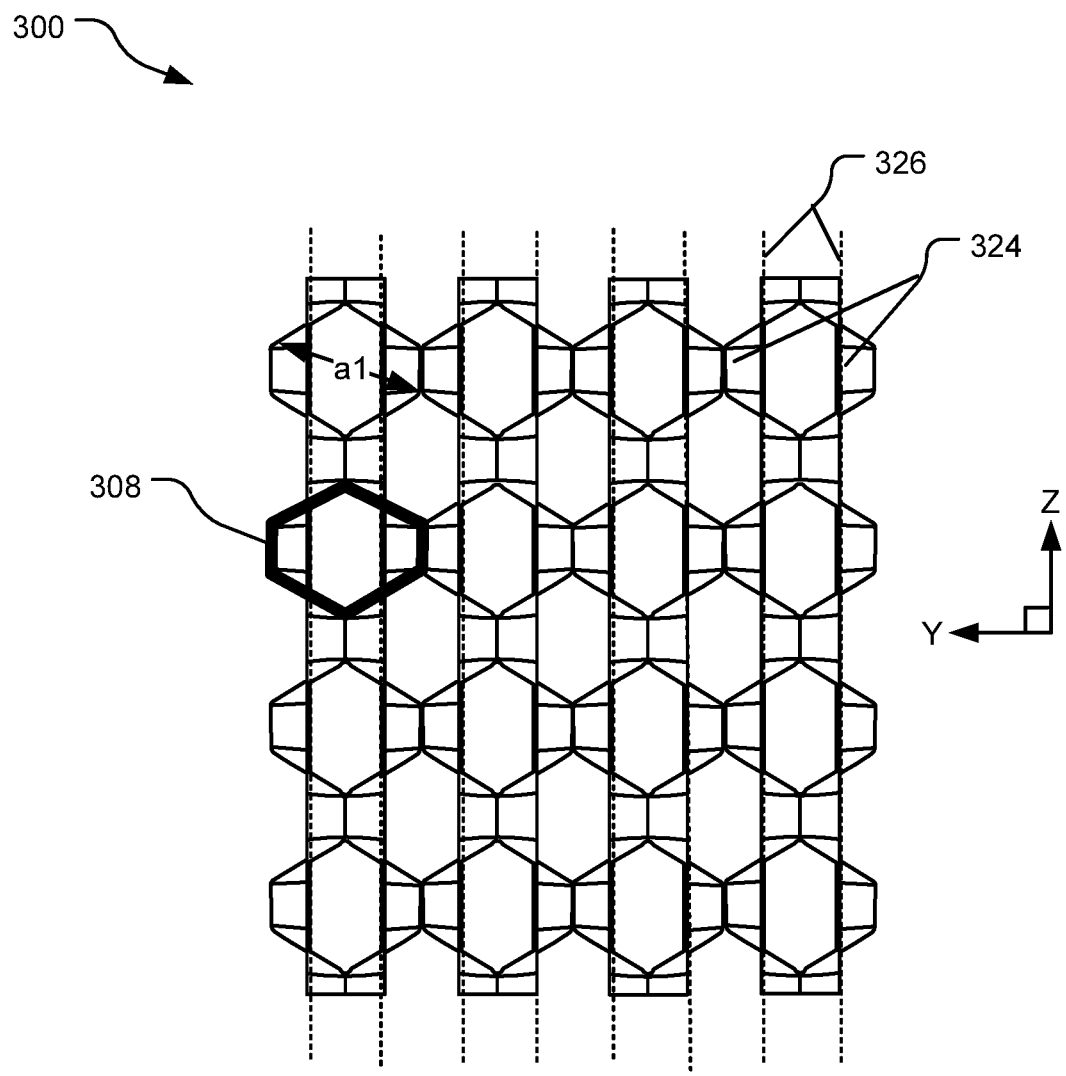
FIG. 3B illustrates a front end-on view of the thermal component that is also shown in FIG. 3A.

FIG. 3B illustrates a front end-on view of the EMI shield portion 306 of the thermal component 300 shown in FIG. 3A taken along the Y-Z plane with respect to the axes illustrated in FIG. 3A. In the illustrated implementation, the cells in EMI shield portion 304 each have a hexagonal cellular body (e.g., a hexagonal body of the cell 308). The base of each cell includes a tapered portion (e.g., tapered portion 324) that tapers sides of the hex-shaped region inward toward the center of the hexagonal cell to direct airflow into a first end of the cell into a channel between a corresponding pair of the fins. For clarity, the relative positions of the fins shown in FIG. 3A are represented by dotted lines (e.g., fin position lines 326). The size of the cellular aperture (a1) of each hexagonal cell (also referred to herein as the cell diameter) may be tailored to ensure that the EMI shield portion 304 functions to prevent passage of EMI waves having a frequency within a target frequency range.

Figure 3C:
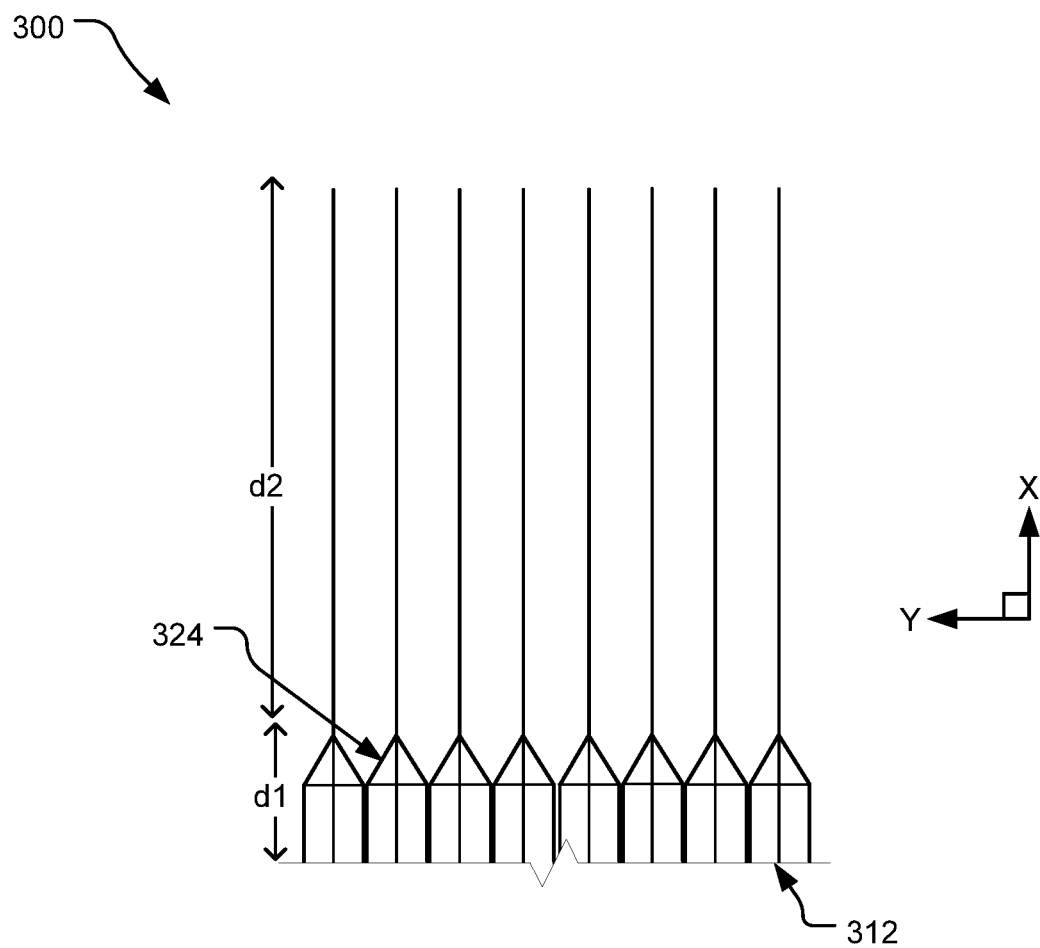
FIG. 3C represents a top-down, cross-sectional view of the thermal component shown in FIG. 3A.

FIG. 3C represents a top-down, cross-sectional view of the thermal component 300 shown in FIG. 3A taken along the X-Y plane with respect to the axes illustrated in FIG. 3A. In this view, tapered portions (e.g., a tapered portions 324) of each cell is visible and a cell depth (d1) shown relative to the fin length (d2). The fin length (d2) may be many times longer than cell depth (d1). In one example implementation, the cell depth is approximately 5 mm and the fin length is approximately 50 mm or more.

Figure 3D:
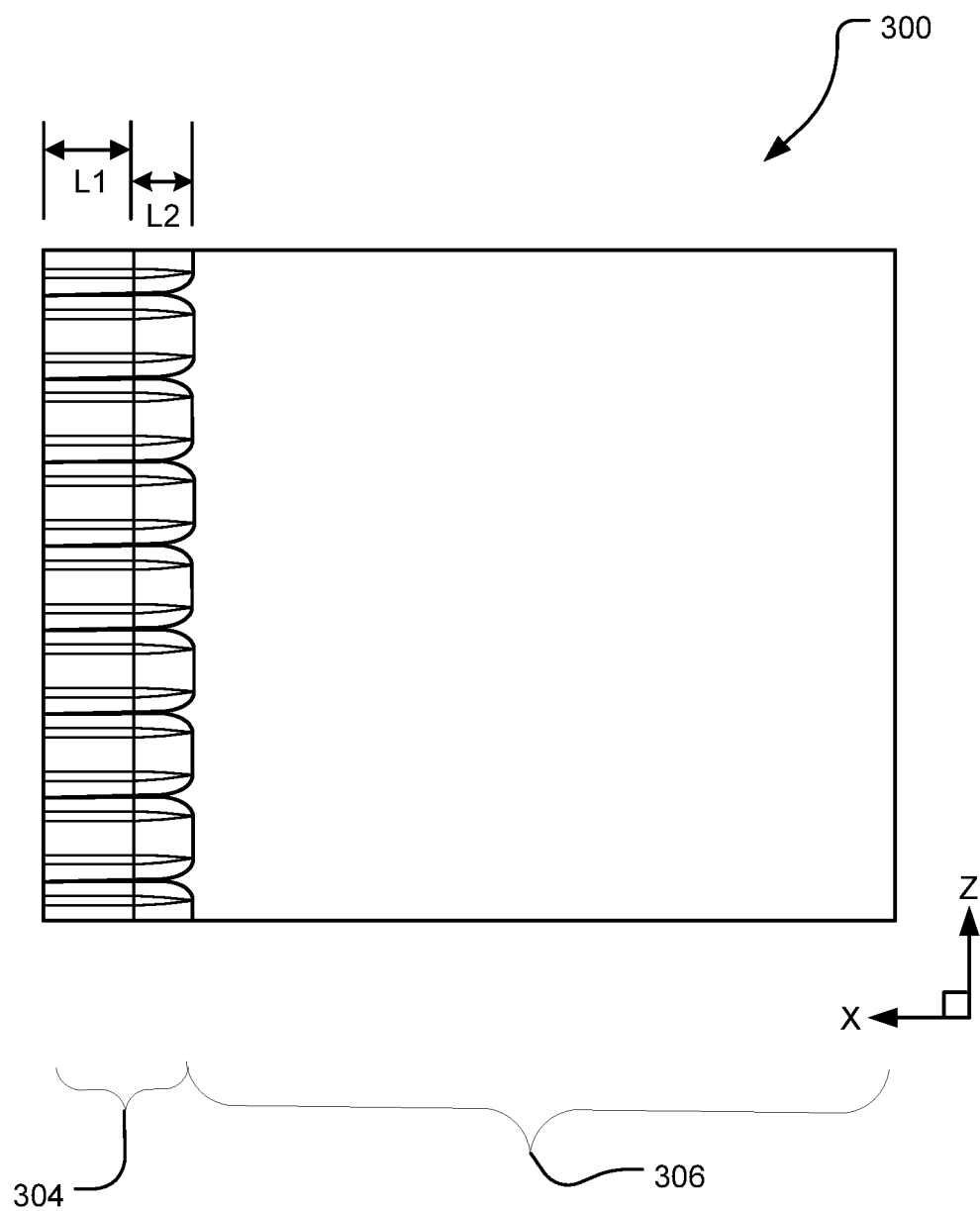
FIG. 3D illustrates another cross-sectional view of the thermal component shown in FIG. 3A.

FIG. 3D illustrates a cross-sectional view of the thermal component 300 shown in FIG. 3A that is taken along the X-Z plane with respect to the axes illustrated in FIG. 3A. In this view, it can be seen that each cell in the EMI shield portion 304 has a main cell portion with a length L1 and a tapered portion with a length L2. The length of the main cell portion (L1) can be tailored to meet RF containment needs. The length of the cell, and therefore the length of the intimate electrical contact from one cell is large enough to create a low-resistance ground path between mating cells.

Better airflow and thermal performance may be realized when this main cell portion (L1) is kept as short as feasible without compromising shield capability in order to more quickly transition the air out of the hexagonal cell and into the lower-impedance channel between parallel fins.

Figure 3E:
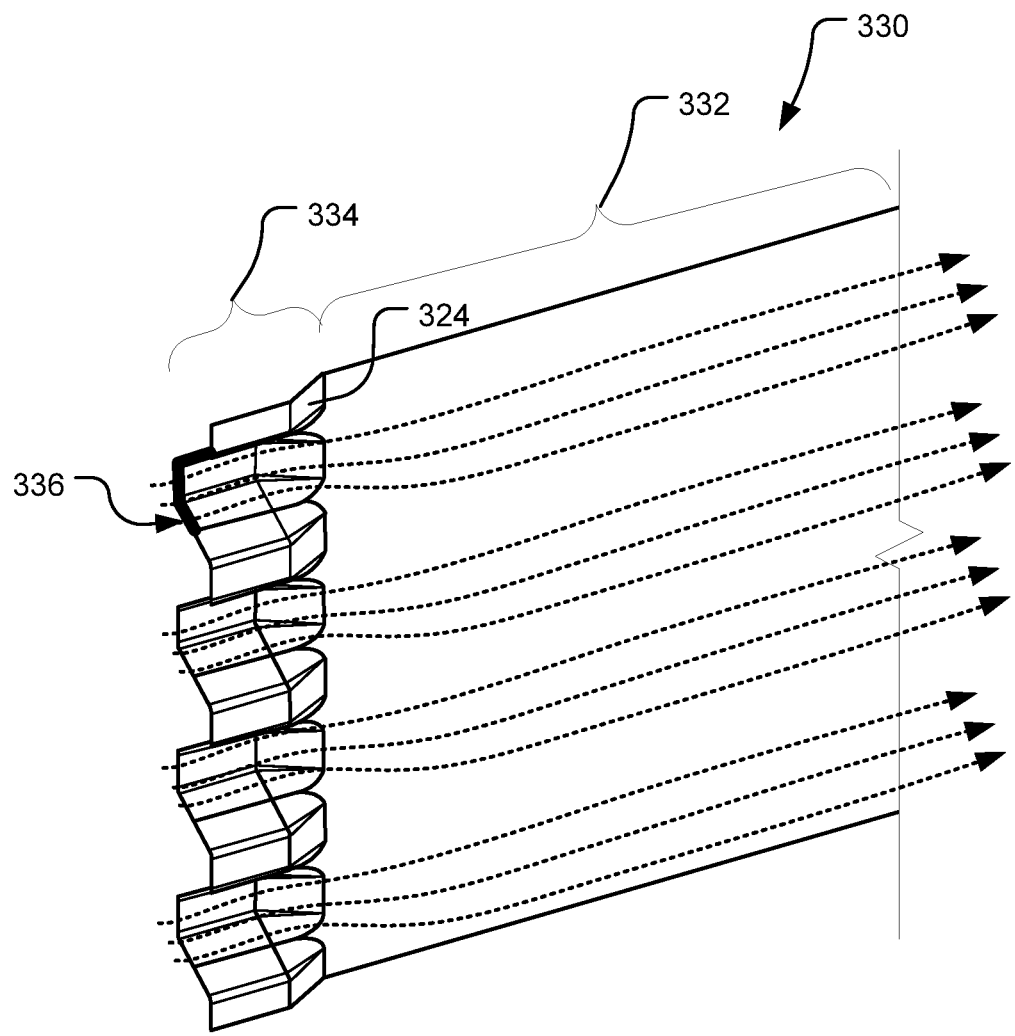
FIG. 3E illustrates a single metal fin component combinable with other like components to form the thermal component shown in FIG. 3A-3D in accordance with some implementations.

FIG. 3E illustrates a single metal fin component 330 combinable with other like components to form the thermal component 300 shown in FIG. 3A-3D. A back portion 332 of the metal fin component 330 forms a fin, which may be positioned parallel to a number of other fins of other metal fin components when integrated within the thermal component 300. A front portion 334 of the metal fin component 330 is shaped to form a portion the above-described honeycomb cellular structure that acts as an EMI shield. For example, a front edge 336 of the metal fin component 330 is shaped to define half of each hexagonal cell forming a column of cells in the thermal component 300, as shown in FIG. 3A. For example, the front edge 336 defines three walls of an upper hexagonal cell illustrated by bolded lines 336a. This detailing effectively directs an airflow (shown by dotted arrows) through each cell and into a channel that is either bounded by a first side of the metal fin component 330 or a second opposite side of the metal fin component 330. In this design, airflow through the channel is not constrained by the cell structure and is therefore allowed to expand into the larger cross-sectional area of the channel. This larger cross-sectional area of the channel possesses an inherently higher hydraulic diameter, which in turn reduces the net airflow impedance.

As illustrated by arrows in FIG. 3E, an airflow is directed through the hexagonal cells of the EMI shield portion, through a tapered portion (e.g., a tapered portion 324), and into a straight channel between two adjacent fins of the heat exchanger portion. This path essentially forms a zig-zag pattern by which the airflow may gradually expand upon exiting the cells of the EMI shield portion, upon entering the channels of the heat exchanger portion, without forcing the flow field through an additional bottleneck entrance point as in some existing designs. Consequently, the disclosed thermal component design may provide a reduction in overall impedance to the airflow throughout the thermal component 300 without compromising either EMI shield capability or thermal dissipation properties. According to one implementation, the illustrated metal fin component 330 is formed using low-cost, high-volume manufacturing methods available today.

Figure 3F:
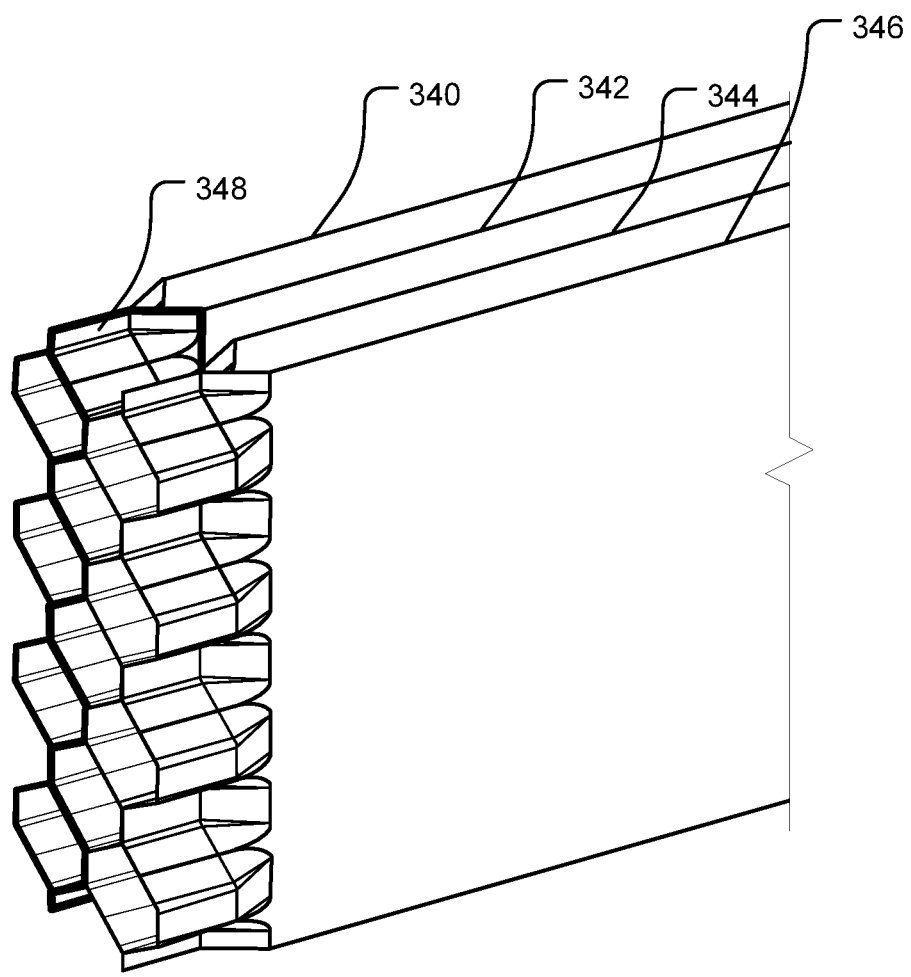
FIG. 3F illustrates example metal fin components that have been connected together to form a portion of the thermal component shown in FIG. 3A-3D.

FIG. 3F illustrates four metal fin components 340, 342, 344, 346 (e.g., the same or similar to metal fin component 330 illustrated with respect to FIG. 3D) that have been connected together to form a portion of the thermal component 300 shown in FIG. 3A. In this design, individual components are formed to have the features generally described above with respect to FIG. 3D. The front edge portion of neighboring metal fin components (e.g., honeycomb section front edge section of metal fin components 340 and 342) are joined at attachment points (e.g., an attachment point 348) to create a conductive path for RF containment through each cell in the left-most column, highlight by bolded lines. Each of these cells in the left most column directs air into a channel formed between the metal fin components 340 and 342. There exist several suitable methods for adjoining together fins at the attachments points including, for example, solder, and interlocking stamped features (e.g., the same or similar to interlocking stamped features described with respect to the implementation of FIG. 2A-2C.

An example thermal component (102) includes a shield (116) comprising a plurality of cells adapted to inhibit radio radiation (RF) having a frequency within a target frequency range and a heat exchanger (118) including a plurality of elongated channels, each one of the elongated channels being physically connected to and in fluid communication with at least one corresponding cell of the plurality of cells.

In one example thermal component according to any preceding thermal component, each channel (322) of the plurality of elongated channels is formed by a pair of fins (314, 316) extending from the shield (304).

In another example thermal component of any preceding thermal component, Each pair of fins (314, 316) is in fluid communication with a subset of the plurality of cells arranged in a column (318) within the shield (304).

In another example thermal component of any preceding thermal component, the plurality of cells in the shield (116) form a honeycomb structure.

In still another example thermal component of any preceding thermal component, the cells of the honeycomb structure are each directly attached to one or more fins (314, 315) of the heat exchanger, each pair of the fins forming one of the elongated channels.

In yet still another example thermal component of any preceding thermal component, each cell (308) in the honeycomb structure has a tapered portion (324) that directs airflow out of the cell (308) and into a corresponding one of the plurality of elongated channels (322).

In still another example thermal component of any preceding thermal component, each one of the plurality of cells (120, 308) has at least one sidewall conductively attached to a sidewall of another one of the plurality of cells.

In another example thermal component of any preceding thermal component, the plurality of elongated channels each have a length (118a) greater than or equal to ten times a maximum diameter of each individual one of the plurality of cells (120).

An example system disclosed herein includes a faraday cage (104) surrounding at least one RF source component (106) or RF susceptible component (106), the faraday cage (104) including at least one sidewall comprising a plurality of cells that form an RF shield (116); and a heat exchanger (118) attached to the RF shield (116), the heat exchanger including a plurality of elongated channels, each one of the elongated channels (e.g., channel with length 118a) being physically connected to and in fluid communication with at least one corresponding cell (of the plurality of cells 120) in the RF shield (116).

In one example system according to any preceding system, each channel (322) of the plurality of elongated channels is formed by a pair of fins (314, 316) extending from the shield (304).

In another example system according to any preceding system, each pair of fins (314, 316) is in fluid communication with a subset of the plurality of cells arranged in a column (318) within the RF shield (304).

In yet another example system according to any preceding system, the plurality of cells in the RF shield (116) form a honeycomb structure.

In yet still another example system of any preceding system, the cells of the honeycomb structure are each directly attached to one or more fins (314, 315) of the heat exchanger (118), each pair of the fins forming one of the elongated channels.

In another example system of any preceding system, each cell (308) in the honeycomb structure has a tapered portion (324) that directs airflow out of the cell (308) and into a corresponding one of the plurality of elongated channels (322).

In yet still another example system of any preceding system, the plurality of elongated channels each have a length (118a) greater than or equal to ten times a maximum diameter of each individual one of the plurality of cells (120).

In another example system of any preceding system, the plurality of cells in the RF shield (116) form a honeycomb structure and each individual cell (12) in the honeycomb structure extends to form a different respective channel of the plurality of elongated channels.

An example ventilation system in an electronic device includes a wall comprising a plurality of cells that form an RF shield (116); a heat exchanger (118) attached to the RF shield (116), the heat exchanger (118) including a plurality of elongated channels, each one of the elongated channels being physically connected to and in fluid communication with at least one corresponding cell of the plurality of cells in the RF shield (116); and a fan positioned on a first side of a shield (e.g., within faraday cage 104) to create an airflow path that directs air sequentially through the plurality of cells (116) and the elongated channels of the heat exchanger (118).

In another example ventilation system of any preceding ventilation system, the plurality of cells form a honeycomb structure and each channel of the plurality of elongated channels is formed by a pair of fins (314, 316) extending from the honeycomb structure. In yet still another example ventilation system of any preceding ventilation system, the channel formed by each pair (314, 316) of fins is in fluid communication with a subset of the plurality of cells (308, 310) within the RF shield (304). An example system disclosed herein includes a faraday cage (104) surrounding at least one RF source component (106) or RF susceptible component (106), the faraday cage (104) including at least one sidewall comprising a plurality of cells that form an RF shield (116); and a heat exchanger (118) attached to the RF shield (116), the heat exchanger including a plurality of elongated channels, each one of the elongated channels (e.g., channel with length 118a) being physically connected to and in fluid communication with at least one corresponding cell (of the plurality of cells 120) in the RF shield (116).

The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language. The above specification, examples, and data, together with the attached appendices, provide a complete description of the structure and use of exemplary implementations.

What is claimed is:

1. A thermal component comprising:
    a shield comprising a plurality of cells adapted to inhibit radio radiation (RF) having a frequency within a target frequency range; and
    a heat exchanger that conductively transfers heat from air flowing through the thermal component to a heat pipe, the heat exchanger including a plurality of elongated conductive channels, each channel of the elongated conductive channels having a wall that is directly physically connected to a cellular wall of at least one corresponding cell of the plurality of cells that is fluid communication with the each channel.

2. The thermal component of claim 1, wherein each channel of the plurality of elongated conductive channels is formed by a pair of fins extending from the shield, each fin of the pair of fins extending from and connecting to a cellular wall of at least one corresponding cell of the plurality of cells.

3. The thermal component of claim 2, wherein the each channel formed by each pair of fins is in fluid communication with a subset of the plurality of cells arranged in a column within the shield.

4. The thermal component of claim 1, wherein the plurality of cells in the shield form a honeycomb structure.

5. The thermal component of claim 4, wherein the cells of the honeycomb structure are each directly attached to one or more fins of the heat exchanger, each pair of the fins forming one of the elongated conductive channels.

6. The thermal component of claim 4, wherein each cell in the honeycomb structure has a tapered portion that directs airflow out of the cell and into a corresponding one of the plurality of elongated conductive channels.

7. The thermal component of claim 1, wherein each one of the plurality of cells has at least one sidewall conductively attached to a sidewall of another one of the plurality of cells.

8. The thermal component of claim 1, wherein the plurality of elongated conductive each have a length greater than or equal to ten times a maximum diameter of each individual one of the plurality of cells.

9. The thermal component of claim 1, wherein the plurality of cells in the shield form a honeycomb structure and each individual cell in the honeycomb structure extends to form a different respective channel of the plurality of elongated conductive channels.

10. A system comprising:
a faraday cage surrounding at least one RF source component or RF susceptible component, the faraday cage including at least one sidewall comprising a plurality of cells that form an RF shield;
a heat exchanger attached to the RF shield, the heat exchanger including a plurality of elongated conductive channels that transfer heat from air flowing through the elongated conductive channels to a heat pipe, each channel of the elongated conductive channels having a wall that is directly physically connected to a cellular wall of at least one corresponding cell of the plurality of cells in the RF shield that is in fluid communication with the each channel.

11. The system of claim 10, wherein each channel of the plurality of elongated conductive channels is formed by a pair of fins extending from the RF shield, each fin of the pair of fins extending from and connecting to a cellular wall of at least one corresponding cell of the plurality of cells.

12. The system of claim 10, wherein the each channel formed by each pair of fins is in fluid communication with a subset of the plurality of cells within the RF shield.

13. The system of claim 10, wherein the plurality of cells in the RF shield form a honeycomb structure.

14. The system of claim 13, wherein each column of cells in the honeycomb structure is fluidly coupled to a different channel of the plurality of elongated conductive channels of the heat exchanger.

15. The system of claim 13, wherein each cell in the honeycomb structure has a tapered portion that directs airflow out of the cell and into a corresponding one of the plurality of elongated conductive channels.

16. The system of claim 10, wherein the plurality of elongated conductive channels each have a length greater than or equal to ten times a maximum diameter of each individual one of the plurality of cells.

17. The system of claim 10, wherein the plurality of cells in the RF shield form a honeycomb structure and each individual cell in the honeycomb structure extends to form a different respective channel of the plurality of elongated conductive channels.

18. A ventilation system in an electronic device comprising:
a wall comprising a plurality of cells that form an RF shield;
a heat exchanger attached to the RF shield, the heat exchanger including a plurality of elongated conductive channels that transfer heat from air flowing through the elongated conductive channels to a heat pipe, each channel of the elongated conductive channels having a cellular wall that is directly physically connected to at least one corresponding cell of the plurality of cells in the RF shield that is in fluid communication with the each channel; and
a fan positioned on a first side of a shield to create an airflow path that directs air sequentially through the plurality of cells and the elongated conductive channels of the heat exchanger.

19. The ventilation system of claim 18, wherein the plurality of cells form a honeycomb structure and each channel of the plurality of elongated conductive channels is formed by a pair of fins extending from the honeycomb structure, each fin of the pair of fins extending from and connecting to a cellular wall of at least one corresponding cell of the plurality of cells.

20. The ventilation system of claim 19, wherein the each channel formed by each pair of fins is in fluid communication with a subset of the plurality of cells within the RF shield.

21. The thermal component of claim 1, wherein each channel of the elongated conductive channels of the heat exchanger has an effective width that matches a diameter of the at least one corresponding cell of the plurality of cells that is fluid communication with the each channel.

22. The system of claim 10, wherein each channel of the elongated conductive channels of the heat exchanger has an effective width that matches a diameter of the at least one corresponding cell of the plurality of cells that is fluid communication with the channel.

23. The ventilation system of claim 18, wherein each channel of the elongated conductive channels of the heat exchanger has an effective width that matches a diameter of the at least one corresponding cell of the plurality of cells that is fluid communication with the each channel.

24. The thermal component of claim 1, wherein the shield is formed of a plurality of different cellular columns, each cellular column of the plurality being formed from a planar component and bent along various deflection points.

* * * * *